(12) United States Patent
Tanaka et al.

(10) Patent No.: US 6,593,063 B1
(45) Date of Patent: *Jul. 15, 2003

(54) METHOD OF MANUFACTURING A SEMICONDUCTOR DEVICE HAVING AN IMPROVED FINE STRUCTURE

(75) Inventors: Mikihiro Tanaka, Hyogo (JP); Takeo Ishibashi, Tokyo (JP)

(73) Assignees: Mitsubishi Denki Kabushiki Kaisha, Tokyo (JP); Ryoden Semiconductor System Engineering Corporation, Hyogo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/514,943

(22) Filed: Feb. 28, 2000

(30) Foreign Application Priority Data

Aug. 26, 1999 (JP) ............................................. 11-240528

(51) Int. Cl.⁷ .................................................. G03C 5/00
(52) U.S. Cl. ...................... 430/311; 430/312; 430/313; 430/325; 430/330; 430/394
(58) Field of Search ................................ 430/311, 312, 430/313, 325, 330, 394

(56) References Cited

U.S. PATENT DOCUMENTS

| 4,024,030 A | * | 5/1977 | Burov et al. ................... 204/15 |
| 5,545,512 A | * | 8/1996 | Nakato ........................ 430/323 |
| 5,744,286 A | * | 4/1998 | Choi ........................... 430/326 |
| 5,858,620 A | * | 1/1999 | Ishibashi et al. ............. 430/313 |

FOREIGN PATENT DOCUMENTS

| JP | 6-250379 | * | 9/1994 |
| JP | 10-73927 |   | 3/1998 |
| JP | 11-204399 |  | 7/1999 |

* cited by examiner

Primary Examiner—Janet Baxter
Assistant Examiner—Amanda C. Walke
(74) Attorney, Agent, or Firm—McDermott, Will & Emery

(57) ABSTRACT

A first resist layer, capable of generating an acid, is formed on a semiconductor base layer and is developed in a shortened developing time than usual. The first resist pattern is covered with a second resist layer containing a material capable of crosslinkage in the presence of an acid. The acid is generated in the first resist pattern by application of heat or by exposure to light, and a crosslinked layer is formed in the second resist pattern at the interface with the first resist pattern as a cover layer for the first resist pattern, thereby the first resist pattern is caused to be thickened. The non linked portion of the second resist layer is removed and the fine resist pattern is formed. Thus, the hole diameter of the resist pattern can be reduced, or the isolation width of a resist pattern can be reduced.

7 Claims, 16 Drawing Sheets

FIG. 4
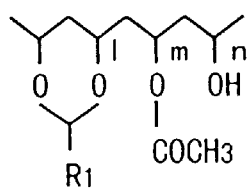
R1=H2CH3
POLYVINYL ACETAL
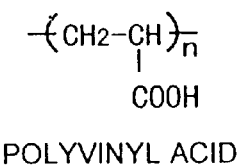
POLYVINYL ACID
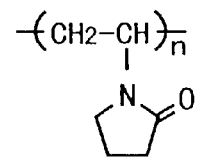
POLYVINYL PYRROLIDONE
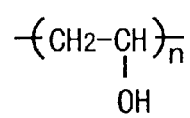
POLYVINYL ALCOHOL
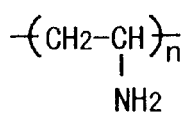
POLYVINYL AMINE
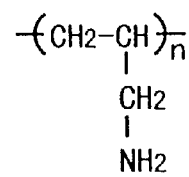
POLYALLYLAMINE
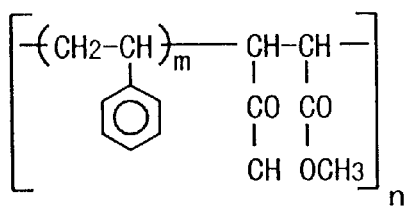
STYRENE-MALEICACID COPOLYMER
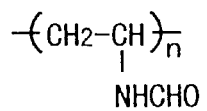
POLY-N-VINYLFORMAMIDE
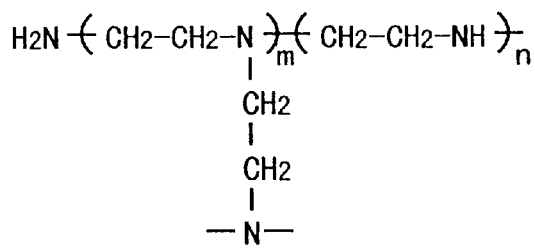
POLYETHYLENEIMIDE
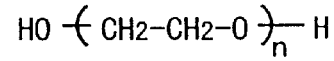
POLYETHYLENE OXIDE
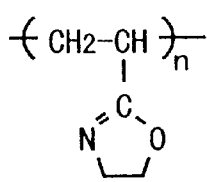
OXAZOLINE-CONTAINING WATER-SOLUBLE RESIN

RESIST PATTERN 0.4 μm 0.4 μm 0.4 μm

RESIST PATTERN 0.3 μm 0.3 μm 0.3 μm

RESIST PATTERN 0.2 μm 0.2 μm 0.2 μm

| MIXING RATIO (wt) | | |
|---|---|---|
| POLYVINYL ACETAL | POLYVINYL ALCOHOL | HOLE SIZE ($\mu$m) |
| 0 | 0 | 0.44→0.44 |
| 1 | 0 | 0.43→0.34 |
| 5 | 1.8 | 0.42→0.39 |
| 5 | 3.7 | 0.40→0.43 |
| 0 | 1 | 0.35→0.44 |

| SAMPLE | HOLE SIZE ($\mu$m) |
|---|---|
| COMPARATIVE PRODUCT | 0.40 |
| ENTIRE SURFACE NOT EXPOSED TO LIGHT | 0.28 |
| ENTIRE SURFACE EXPOSED TO LIGHT | 0.25 |

FIG. 16(a)
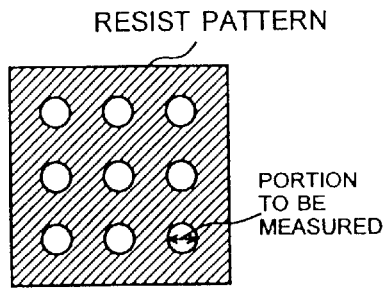
FIG. 16(b)
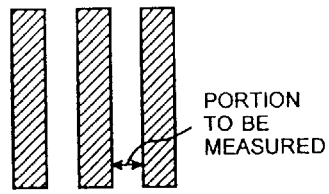
FIG. 16(c)
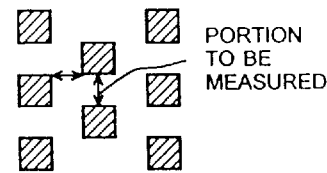
FIG. 17
| MB TEMPERATURE (°C) | | HOLE SIZE (μm) | LINE SPACE (μm) | ISLAND SPACE (μm) |
|---|---|---|---|---|
| EXAMPLE 2 | RESIST ALONE | 0.39 | 0.40 | 0.40 |
| 105 | | 0.29 | 0.32 | 0.31 |
| 115 | | 0.28 | 0.31 | 0.27 |
| 125 | | 0.24 | 0.29 | 0.24 |
FIG. 18
| | | MB TEMPERATURE (°C) | |
|---|---|---|---|
| | CONCENTRATION OF METHOXYETHYLENE-UREA (wt%) | 100 | 110 |
| | EXAMPLE 3 | 0.41 | 0.41 |
| POLYVINYL ACETAL | 0 | 0.39 | 0.38 |
| | 11 | 0.37 | 0.37 |
| | 20 | 0.33 | 0.30 |
| | 27 | 0.29 | 0.27 |
| POLYVINYL ALCOHOL | 0 | | 0.41 |
| | 20 | | 0.37 |
| | 40 | | 0.33 |

FIG. 19

| WATER SOLUBLE MATERIAL | HOLE SIZE (μm) |
|---|---|
| EXAMPLE 3 | 0.24 |
| POLYVINYL ACETAL RESIN ALONE | 0.36 |
| POLYVINYL ACETAL RESIN + N-METHOXYMETHYL-METHOXYMETHYLENEUREA | 0.28 |
| POLYVINYL ACETAL RESIN + N-METHOXYMETHYL-HYDROXYMETHYLENEUREA | 0.34 |
| POLYVINYL ACETAL RESIN + N-METHOXYMETHYL-UREA | 0.24 |

FIG. 20

| AGENT FOR UPPER LAYER | RESIST PATTERN SIZE (INITIAL VALUE, μm) | PATTERN SIZE AFTER TREATMENT (μm) | |
|---|---|---|---|
| | | MIXING BAKE TEMPERATURE | |
| | | 105°C | 115°C |
| POLYVINYL ACETAL RESIN + ETHYLENEUREA (10wt%) | 0.30 | 0.27 | 0.22 |
| POLYVINYL ACETAL RESIN + ETHYLENEUREA (20wt%) | 0.30 | 0.23 | 0.17 |
| POLYVINYL ACETAL RESIN + POLYVINYL ALCOHOL (10wt%) | 0.30 | 0.28 | 0.28 |

FIG. 21

| AGENT FOR UPPER LAYER | RESIST PATTERN SIZE (INITIAL VALUE, μm) | PATTERN SIZE AFTER TREATMENT (μm) | |
|---|---|---|---|
| | | MIXING BAKE TEMPERATURE | |
| | | 105°C | 115°C |
| POLYVINYL ACETAL RESIN + METHOXYUREA (10wt%) | 0.22 | 0.20 | 0.16 |
| POLYVINYL ACETAL RESIN + METHOXYUREA (20wt%) | 0.22 | 0.16 | 0.12 |
| POLYVINYL ACETAL RESIN + POLYVINYL ALCOHOL (10wt%) | 0.22 | 0.20 | 0.20 |

|  | RESIST PATTERN SIZE | PATTERN SIZE AFTER TREATMENT |
|---|---|---|
| EXAMPLE 2 | 0.39 |  |
| EXAMPLE 21 | PORTION IRRADIATED WITH EB | 0.39 |
|  | PORTION NOT IRRADIATED WITH EB | 0.24 |

EXAMPLE 2
(RESIST ALONE)

ETHYLENEUREA 40%

ETHYLENEUREA 10%

METHOD OF MANUFACTURING A SEMICONDUCTOR DEVICE HAVING AN IMPROVED FINE STRUCTURE

BACKGROUND OF THE INVENTION

1. Field of the Invention

The present invention relates to a method of forming a fine resist pattern and a method of manufacturing a semiconductor device using the finely isolated resist pattern, and further relates to a semiconductor device manufactured according to the method.

2. Background Art

As the semiconductor devices have been highly integrated, interconnections and isolation widths required in their manufacturing processes has become very fine. In general, a fine pattern is formed according to a method wherein a resist pattern is formed by a photolithographic technique, and various underlying thin films are respectively etched through the thus formed pattern as a mask.

For the formation of a fine pattern, the photolithographic technique is thus very important. The photolithographic technique includes resist coating, mask alignment, exposure to light, and development. This technique has a limit on the fineness due to the restriction imposed on the wavelength of the exposing light.

Further, the conventional lithographic process has a difficulty in controlling an etching resistance of a resist, making it impossible to fully control a surface profile so that the etched pattern is roughened on the surfaces of side walls by the control of the etching resistance.

As described above, when using the conventional photolithographic technique comprising light exposure, it has been difficult to form a fine resist pattern which exceeds the limit of the wavelength. In order to improve the situation, the present inventors have found a new method to form a fine resist pattern which is beyond the wave length limitation as presented in the Japanese patent publication H10-73927, which corresponds to U.S. patent application Ser. No. 09/049,072 filed Mar. 27, 1998. The present invention aims to further improve the former invention.

SUMMARY OF THE INVENTION

The present invention provides a technique which realize the formation of a finely isolated resist pattern for forming a fine isolation pattern or a fine hole pattern exceeding the wavelength limit. The present invention also provides a technique of roughening the surfaces of side walls of a pattern after etching, which has been difficult in control according to the conventional lithographic technique.

Further, the present invention provides a method for manufacturing a semiconductor device by use of the technique of forming a finely isolated resist pattern, and also provides a semiconductor device manufactured by the method.

According to one aspect of the present invention, in a method of manufacturing a semiconductor device, a first resist layer is formed on a semiconductor base layer, and the first resist layer is made of a first resist and capable of generating an acid. A first resist pattern is formed from said first resist layer by developing in a reduced developing time, and said first resist pattern is capable of generating an acid. A second resist layer is formed on said first resist pattern, and said second resist layer is capable to undergo crosslinking reaction in the presence of an acid. A crosslinked film is formed at a portion of said second resist layer contacting with said first resist pattern by the agency of an acid fed from said first resist pattern. A second resist pattern is formed by removing non-crosslinked portions of said second resist layer. Finnaly, said semiconductor base layer is etched through said second resist pattern working as a mask.

In another aspect of the present invention, in the method, said reduced developing time is in the range of time where the final dimension of said first resist pattern vary depending on the developing time.

In another aspect of the present invention, in the method, said reduced developing time is in the range of time where the final dimension of said first resist pattern is larger more than 10 nm than when developed with usual developing time where final dimension comes of the resist pattern to be substantially constant.

Other and further objects, features and advantages of the invention will appear more fully from the following description.

BRIEF DESCRIPTION OF THE DRAWINGS

FIG. 4 shows examples of the water soluble resins used as the second resist according to the first embodiment of the present invention;

FIGS. 16(a) to 16(c) show second resist patterns in Example 16 of the present invention;

FIG. 17 is a table showing the relation between the mixing bake temperature and the resist pattern size after formation of crosslinked layer in Example 16 of the present invention;

FIG. 18 is a table showing the relation between the mixing ratio of water-soluble materials and the resist pattern size after formation of crosslinked layer in Example 17 of the present invention;

FIG. 19 is a table showing the relation between the amounts of water-soluble materials and the resist pattern size after formation of crosslinked layer in Example 18 of the present invention;

FIG. 20 is a table showing the relation between the mixing ratio of water-soluble materials or the mixing bake temperature and the resist pattern size after formation of crosslinked layer in Example 19 of the present invention;

FIG. 21 is a table showing the relation between the types of water-soluble materials and the resist pattern size after formation of crosslinked layer in Example 20 of the present invention;

DETAILED DESCRIPTION OF THE PREFERRED EMBODIMENTS

This invention will be described in further detail by way of embodiments and examples with reference to the accompanying drawings.

First Embodiment

Figure 1:
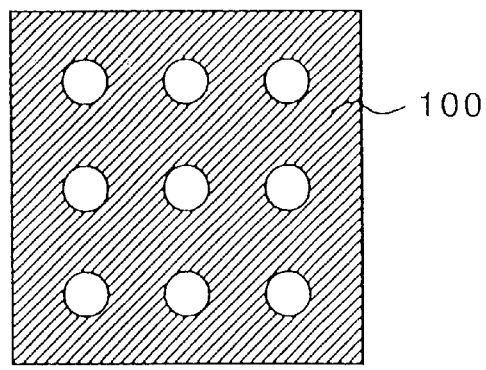
FIGS. 1(a) to 1(c) are views showing a mask pattern illustrating a method for forming a resist pattern according to a first embodiment of the present invention.
Figure 1:
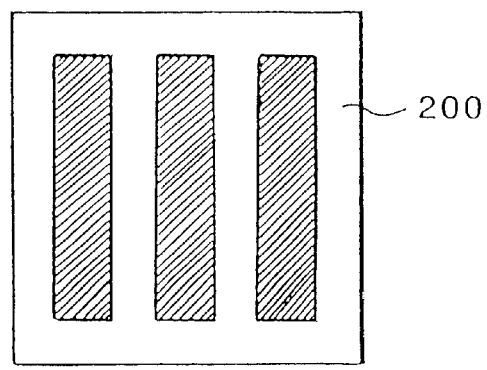
Figure 1:
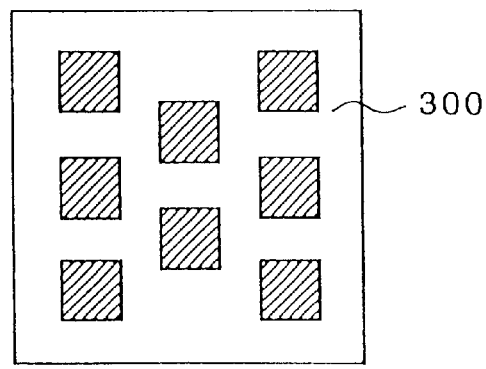

FIGS. 1(a) to 1(c) are views showing a mask pattern used to form a finely isolated resist pattern, to which the present invention is directed. FIG. 1(a) is a mask pattern 100 of fine holes, FIG. 1(b) is a mask pattern 200 of fine spaces, and FIG. 1(c) is an island pattern 300.

FIGS. 2(a) to 2(e), FIGS. 3(a) to 3(f), FIGS. 6(a) to 6(f), and FIGS. 7(a) to 7(f) respectively show process flow charts illustrating a method for forming a finely isolated resist pattern according to a first embodiment of the present invention.

Referring now to FIGS. 1(a) to 1(c) and FIGS. 2(a) to 2(e), a method for forming a finely isolated resist pattern and a method for manufacturing a semiconductor device using the same in the first embodiment are described.

Figure 2A:
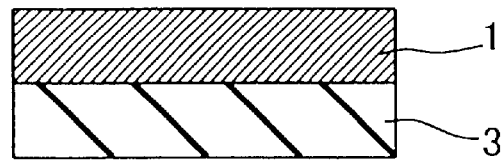
FIGS. 2(a) to 2(e) show process flow charts illustrating a method for forming a resist pattern according to the first embodiment of the present invention.

First, as shown in FIG. 2(a), a first resist 1 is formed on a semiconductor substrate or semiconductor wafer or substrate 3 in a thickness of about 0.7 to 1.0 $\mu$m for example. The first resist 1 has a mechanism of generating an acid from inside thereof by an appropriate thermal treatment.

This first resist 1 may be coated by spin coating, for example, onto the semiconductor substrate 3, followed by pre-baking, i.e. a thermal treatment at 70 to 110° C. for around 1 minute, to cause a solvent in the first resist 1 to be evaporated.

Thereafter, in order to form a first resist pattern, the first resist 1 is exposed to light through a mask having a pattern as shown in FIG. 1(a), 1(b) or 1(c). The exposure light or beam may be a g ray, an i ray, deep UV light, KrF excimer laser beam, ArF excimer laser beam, an electron beam (EB), an X-ray or the like, which has a wavelength corresponding to a sensitizing wavelength of the first resist 1.

The material for the first resist 1 may be the one which has a mechanism to generate an acidic component inside the resist by an appropriate thermal treatment, and may be of the positive or negative type.

For instance, the first resist 1 may be a positive resist constituted of novolac resin and a naphthoquinonediazide photosensitive agent.

Further, a chemically amplified resist which make use of an acid generating mechanism may also be used as the first resist. Other types of resist materials may also be used so far as they utilize reaction systems of generating an acid by application of heat.

After the light exposure of the first resist 1, post-exposure baking (PEB) may be performed, for example at a PEB temperature of 50 to 130° C., if necessary, to improve the resolution of the resist 1.

Subsequently, an alkaline aqueous solution of about 0.05 to 3.0 wt % of TMAH (tetra methyl ammonium hydroxide) is used for development. The feature of the present invention is to achieve substantial shortening of the time required for the development.

Figure 2:
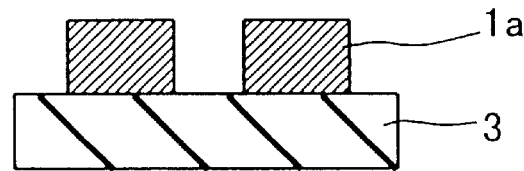
Figure 2:
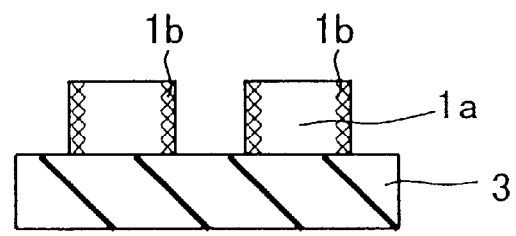

FIG. 2(b1) shows a first resist pattern 1a formed in this way.

FIG. 2(b2) shows a state of acid 1b remaining in the first resist pattern 1a. In the present invention, the density of acid 1b remaining in the surface layer of the first resist pattern 1a is made substantially high compared with the preceding technologies with a normal or usual developing time. As explained later, this will contribute to increase a thickness of the cross linking layer.

After completion of the development, a post-developing baking may be effected, for example, at a baking temperature of 60 to 120° C. for around 60 seconds, if necessary. This thermal treatment affects a subsequent mixing reaction, and should preferably been set at an appropriate temperature corresponding to the type of first resist or second resist.

The above steps are similar to those of forming a resist pattern according to an conventional resist-forming process except that there is used the first resist 1 capable of generating an acid.

Just for reference, the process so far will be reviewed here. The process up to this point generally includes and performed in the following sequence, i.e. (1) baking to expel water content, (2) HMDS disposal, (3) resist coating, (4) post-coating baking, (5) exposure, (6) post-exposure baking, (7) developing, (8) post-development baking. In the present invention, the developing time in the step (7) is intently reduced.

Figure 2C:
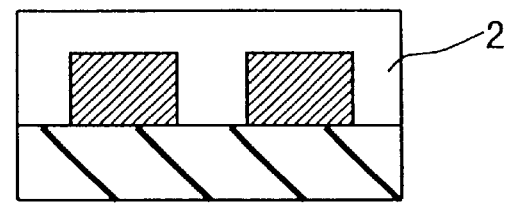

Next, as shown in FIG. 2(c), a second resist 2 is coated onto the semiconductor substrate 3. The second resist is mainly composed of a crosslinkable material capable of crosslinkage in the presence of an acid, and is dissolved in a solvent incapable of dissolving the first resist 1 or 1a in FIG. 1(a), 1(b) or 1(c), The coating method of the second resist 2 is not critical provided that it can be uniformly coated onto the first resist pattern 1a. The second resist may be coated by spray coating, spin coating, or dipping into a second resist solution.

After coating of the second resist 2, the resist 2 may be pre-baked, for example, at 85° C. for around 60 seconds, if necessary.

Figure 2D:
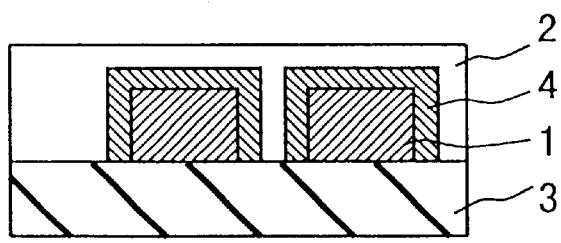

Next, as shown in FIG. 2(d), the first resist pattern 1a and the second resist 2 formed on the semiconductor substrate 1 are thermally treated or mixing baked, which may be hereinafter referred to simply as MB, for example, at a baking temperature of 85 to 150° C. Thereby, the acid is caused to diffuse from the first resist pattern 1a into the second resist 2, and crosslinking reaction occurs at the interface between the second resist 2 and the first resist pattern 1a. The mixing bake temperature/time is, for example, 85° C. to 150° C./60 to 120 seconds, and optimal conditions may be set depending on the types of resist materials and the necessary thickness of the reaction layer.

By the mixing bake, the crosslinked layer 4 wherein the crosslinking reaction has taken place is formed in the second resist 2 to cover the first resist pattern 1a therewith.

Figure 2E:
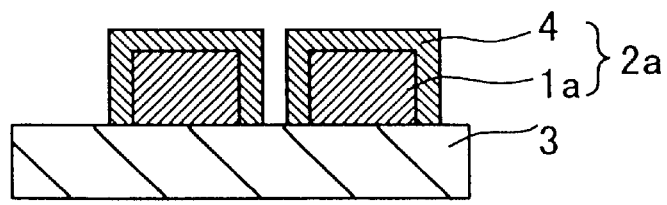

Next, as shown in FIG. 2(e), using a liquid developer such as water or an alkaline aqueous solution such as TMAH, the non-crosslinked portions of the second resist 2 are developed and removed to form a second resist pattern 2a. In this way, a resist pattern can be obtained which has a reduced inner diameter of a hole pattern, a reduced isolation width of a line pattern, or an increased area of an island pattern.

Now, the effect of the shortening of the developing time will be explained.

The inventors of the present invention have found that, when a first resist pattern 1a is formed in transition from the state of FIG. 2(a) to the state of FIG. 2(b1), the density of the acid remaining in the surface layer of the first resist pattern 1a is rendered low and the mutual solubility is low, if the developing time is usual.

In the present invention, the developing time is intentionally shortened, by which the density of the acid remaining in the surface layer of the first resist pattern 1a is made high, and the mutual solubility is made high.

As a result, the cross linking reaction is enhanced in the process of FIG. 2(d), and the cross linked layer is formed thick. That is the framework of the resist pattern is increased.

According to the experiments of the present inventors, the thickness of the cross linked layer (framing thickness) was 70 nm when the developing time was 60 seconds as usual. When the developing time was 40 seconds, the thickness of the cross linked layer was 80 nm.

Further, according to the experiments by the present inventors, it was revealed that shorter the developing time, thicker the cross linked layer. That is the frame-worked thickness was increased.

Following the shortened time developing, the non linked portion of the first resist 1 is developed and removed, resulting in a decreased fine gap of the second resist pattern 2. In this way, a resist pattern can be obtained which has a further reduced inner diameter of a hole pattern, a further reduced isolation width of a line pattern, or a further increased area of an island pattern.

As described above, in the method for forming a fine resist pattern shown with reference to FIGS. 2(a) to 2(e), the second resist layer 2 is formed on the first resist pattern 1a, and then an acid is generated in the first resist pattern 1a by an appropriate thermal treatment and is diffused into the second resist 2.

Now, another procedure of generating an acid by exposure to light in place of or prior to the thermal treatment is described.

Figure 3:
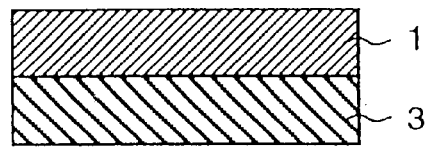
FIGS. 3(a) to 3(f) show process flow charts illustrating a method for forming a resist pattern according to the first embodiment of the present invention.
Figure 3:
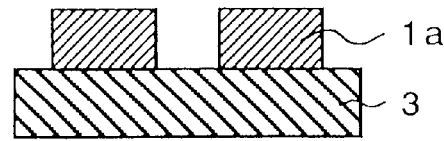
Figure 3:
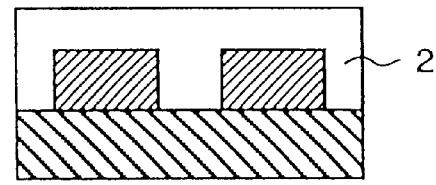
Figure 3:
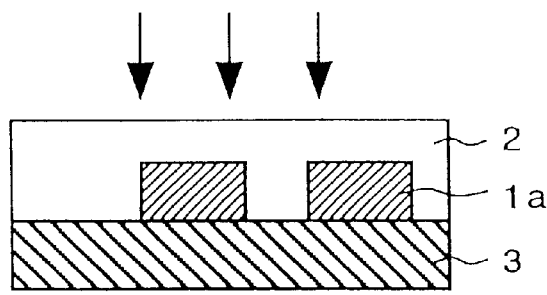
Figure 3:
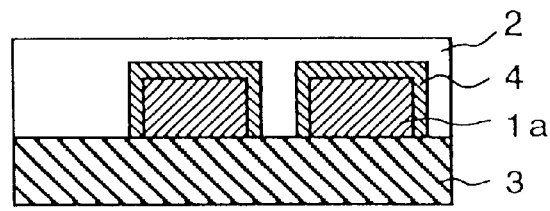
Figure 3:
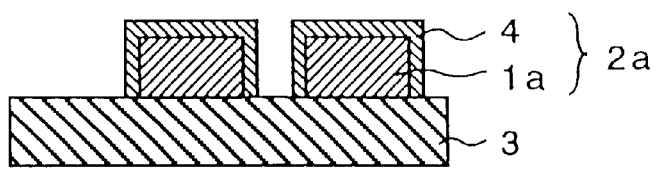

FIGS. 3(a) to 3(f) show a flow chart illustrating a method for forming a finely isolated resist pattern in this procedure. The steps shown in FIGS. 3(a) to 3(c) are similar to those of FIGS. 2(a) to 2(c), so that the duplicating explanation will not be given. The reducing of the developing time for forming a first resist pattern 1a shown in FIG. 3(b) is similar as explained in the first embodiment.

It will be noted that the first resist 1 may be a chemically amplified resist which make use of a mechanism of generating an acid by exposure to light. In the chemically amplified resist, formation reaction of an acid catalyst occurs by application of light, an electron beam, an X-ray or the like, and the amplification reaction caused by the acid catalyst is utilized.

After formation of the second resist 2 shown in FIG. 3(c), the semiconductor substrate 1 is again exposed to the g-ray or i-ray of a Hg lamp on the entire surface thereof as is particularly shown in FIG. 3(d). Thereby, an acid is caused to generate in the first resist pattern 1a. As a result, as shown in FIG. 3(e), a crosslinked layer 4 is formed along the interface of the second resist 2 with the first resist pattern 1a.

As a light source used for the exposure, there may be used Hg lamps, a KrF excimer, an ArF excimer and the like, depending on the sensitizing wavelength of the first resist 1 or 1a. The light source is not critical so far as an acid is generated by exposure to light, and an appropriate tight source or exposure may be selected depending on the sensitizing wavelength of the applied first resist 1.

As described above, in the method shown in FIGS. 3(a) to 3(f), light is exposed after the coating of the second resist 2, and an acid is generated in the first resist pattern 1a. Since light is exposed in such a state that the first resist pattern 1a is covered with the second resist 2, an amount of the acid generated in the first resist pattern 1a can be precisely controlled over a wide range by controlling an exposure. Thus, the thickness of the reaction layer 4 can be accurately controlled.

If necessary, the semiconductor substrate 1 is thermally treated or mixing baked at 60 to 130° C., for example. Through the thermal treatment, the acid from the first resist pattern 1a is more diffused into the second resist 2, thereby facilitating the crosslinking reaction to occur at the interface between the second resist 2 and the first resist pattern 1a. The mixing bake temperature/time is 60 to 130° C. and 120 seconds, within which optimal conditions are set depending on the types of resist materials and the necessary thickness of the reaction layer.

By the mixing bake, the crosslinked layer 4 is formed in the second resist 2 to cover the first resist pattern 1a therewith.

The step in FIG. 3(f) is similar to that of FIG. 2(e).

In the present embodiment too as in the first embodiment, the density of the acid remaining in the surface layer of the first resist pattern 1a is made high, and the thickness of the cross linked layer 4 is made large. That is the frame-worked thickness of the resist pattern is increased.

In this way, there can be obtained a resist pattern wherein a hole inner diameter or an isolation width of a line pattern is reduced, or an area in an island pattern is enlarged.

The above method, i.e. the method of generating an acid component in the first resist pattern 1a by exposure to light, as illustrated with reference to FIGS. 3(a) to 3(f), is suitably applied for the case where the reactivity of the first resist 1 and the second resist 2 is relative low, or for the case where a relatively thick crosslinked layer is required, or for the case where the uniform crosslinking reaction is particularly required.

Next, the material for the second resist 2 is explained.

The second resist may be composed of a crosslinkable water-soluble resin alone or a mixture of these resins. Alternatively, a water-soluble crosslinking agent alone or a mixture of these agents may also be used. Likewise, mixtures of these water-soluble resins and water-soluble crosslinking agents may be used.

Where a mixture is used as the second resist, its optimal composition should be determined depending on the type of first resist material and prescribed reaction conditions, and is not limited to any specific one.

Further, as the second resist, preferably used is a copolymer composed of two or more kinds of water soluble-resins as a main component, which is capable of generating or undergoing crosslinking reaction in the presence of an acid.

Examples of the water soluble resins used as the second resist include, as shown in FIG. 4, polyacrylic acid, polyvinyl acetal, polyvinylpyrrolidone, polyvinyl alcohol, polethyleneimine, polyethylene oxide, styrene-maleic acid copolymer, polyvinylamine resin, polyallylamine, oxazoline group-containing resins, water-soluble melamine resins, water-soluble urea resins, alkyd resins, sulfone amide resins, and the like. The resins are not critical if they undergo crosslinking reaction in the presence of an acidic component. Alternatively, if they do not undergo crosslinking reaction, it is sufficient that the resins are miscible with a water-soluble crosslinking agent. These resins may be effectively used on their own or in combination.

These water-soluble resins may be used singly or in combination of two or more, and may be appropriately adjusted depending on and the reaction conditions and the reactivity with the underlying first resist 1.

These water-soluble resins may be converted to salts, such as hydrochloride, for the purpose of improving the solubility in water.

Figure 5:
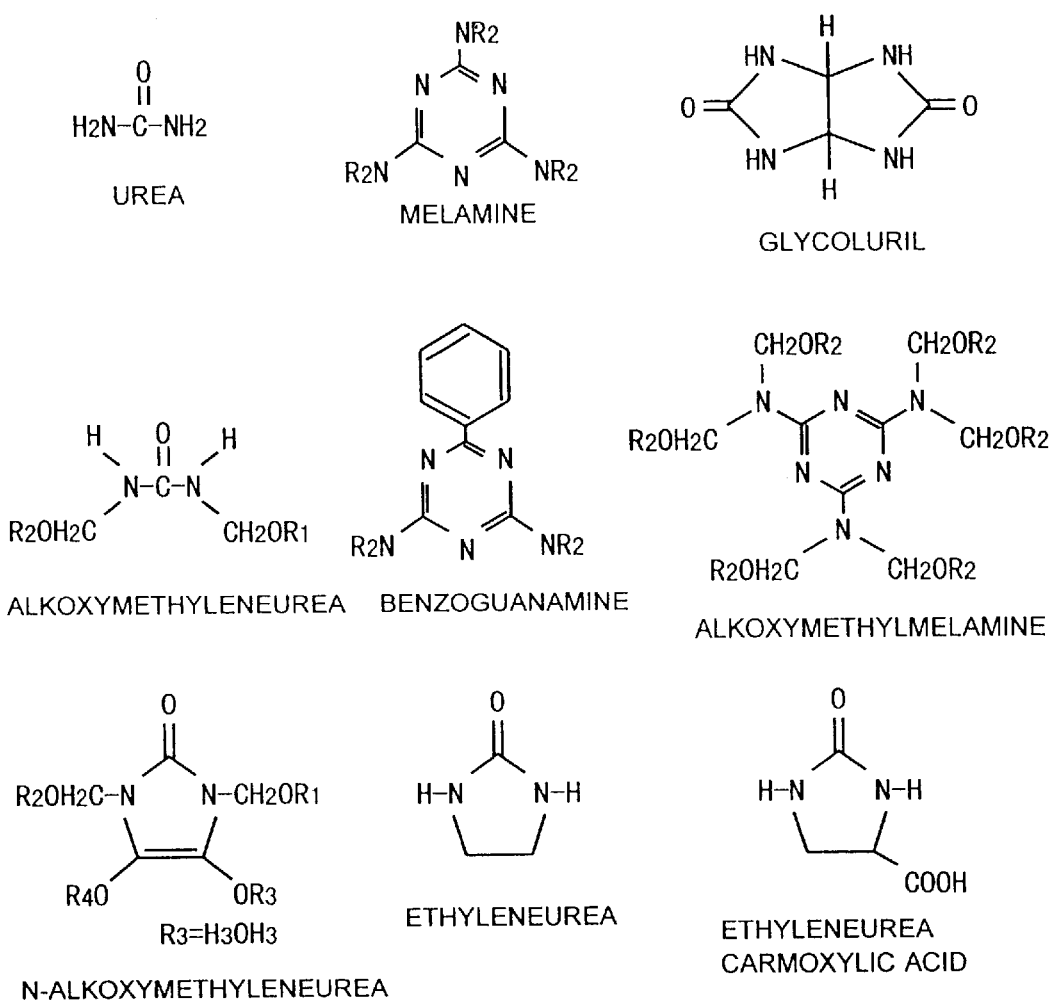
FIG. 5 shows examples of the water-soluble crosslinking agents used as the second resist according to the first embodiment of the present invention.

Next, the water-soluble crosslinking agents used as the second resist include, as shown in FIG. 5, urea group crosslinking agents such as urea, alkoxymethylene ureas, N-alkoxymethylene ureas, ethyleneurea, ethylene urea carboxylates and the like, melamine group crosslinking agents such as melamine, melamine derivative including alkoxymethylenemelamine, and amino crosslinking agents such as benzoguanamine, glycoluril and the like. Thus, the second resist may not be limited to amino crosslinking agents, and may include any of water-soluble crosslinking agents that generates crosslinking in the presense of acid.

Further, water-soluble resist materials used for the second resist may be a mixtures of these resins and the crosslinking agents. In this mixtures, the resins may be used singly or in combination, and the crosslinking agents may be used singly or in combination too.

For instance, preferably used is a mixture of a polyvinyl acetal resin as the water-soluble resin and ethyleneurea as the water-soluble crosslinking agent. In this case, because of the high solubility in water, the solution of the mixture exhibits good storage stability.

It will be noted that the material applied to as the second resist not critical provided that it is soluble in water or soluble in a water-soluble solvent incapable of dissolving the first resist pattern and undergoes crosslinking reaction in the presence of an acidic component.

As set forth hereinbefore, the crosslinking reaction may proceed only by thermal treatment without generation of an acid by re-exposure of the first resist pattern 1$a$. In this case, it is preferred that a material of high reactivity should be selected as the second resist 2 and that an appropriate thermal treatment, for example, at 85° C. to 150° C., should be effected.

As a specific example, preferably used as a second resist is a water-soluble composition comprising polyvinyl acetal resin and ethyleneurea, or a composition comprising polyvinyl alcohol and ethyleneurea, or a mixture thereof at appropriate ratios.

Next, in the present invention, it is important to control the crosslinking reaction between the first resist 1 and the second resist 2 and also to control the thickness of the crosslinked layer 4 formed on the first resist pattern 1$a$. The crosslinking reaction should be optimized depending on the reactivity between the first resist 1 and the second resist 2, the shape of the first resist pattern 1$a$, and the intended thickness of the crosslinked layer 4.

The control of the crosslinking reaction between the first resist and the second resist can be performed by controlling process conditions or by controlling the composition of the second resist material.

The effective process control of the crosslinking reaction may be done by (1) the control of an exposure to the first resist pattern 1$a$, or (2) the control of the MB (mixing bake) temperature and treating time. Especially, when the heating and crosslinking time (MB time) is controlled, the thickness of the crosslinked layer can be controlled. This method ensures a very good reaction control.

From the viewpoint of controlling the material composition used as the second resist, the control of the crosslinking reaction may be done by (3) a technique wherein two or more of appropriate water-soluble resins are mixed at a controlled mixing ratio to control reactivity with the first resist, or (4) a technique of mixing an appropriate water-soluble crosslinking agent with a water-soluble resin at a controlled mixing ratio to control reactivity with the first resist.

However, these controls of the crosslinking reaction are not univocally determined, but should be determined while taking into account various conditions including (1) reactivity between the second resist material and the first resist material, (2) the shape and thickness of the first resist pattern, (3) the intended thickness of the crosslinked layer, (4) usable exposure conditions or MB conditions, and (5) coating conditions.

In particular, it is known that the reactivity between the first resist and the second resist suffers an influence of the material composition of the first resist. In the practice of the present invention, the material composition of the second resist should preferably be optimized while taking the above-mentioned factors or conditions into consideration.

Accordingly, the types and compositional ratio of water-soluble material used as the second resist are not critical, and should be optimally determined depending on the types of materials and thermal treating conditions.

It will be noted that plasticizers, such as ethylene glycol, glycerine, triethylene glycol and the like, may be added to the second resist material as an additive.

It will be also noted that, in order to improve the film-forming properties, surface active agents, e.g. water-soluble surface active agents such as Florade of Sumitomo 3M Limited and Nonipole of Sanyo Chemical Industries Ltd., may be added to the second resist material as an additive.

Next, the solvents for use with the second resist will be explained.

The solvents used for the second resist should not dissolve the first resist pattern and should well dissolve water-soluble materials. The solvents are not critical provided that the above requirements are satisfied.

For instance, the solvents for the second resist may be water (pure water), water and alcoholic solvents such as IPA, or water-soluble organic solvents such as N-methylpyrrolidone, and may be used singly or in combination.

The solvents mixed with water are not critical provided that they are soluble in water. Examples include alcohols such as ethanol, methanol, isopropyl alcohol and the like, $\gamma$-butyrolactone, acetone, and the like. The solvent is mixed at a ratio in a range not dissolving the first resist pattern while taking into account the solubility of a material for the second resist.

In the foregoing example, a method of forming a fine resist pattern over the entire surface of the semiconductor substrate 1 has been described. Next, a method for forming a fine resist pattern selectively on a desired region or regions of the semiconductor substrate 1 is described.

FIGS. 6(a) to 6(f) show a process flow of the formation method of a fine resist pattern.

Figure 6:
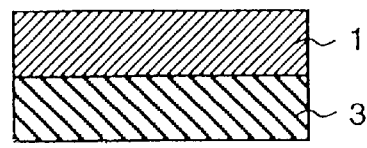
FIGS. 6(a) to 6(f) show process flow charts illustrating a method for forming a resist pattern according to the first embodiment of the present invention.
Figure 6:
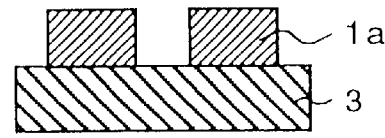
Figure 6:
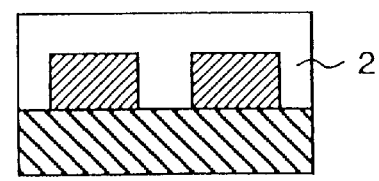
Figure 6:
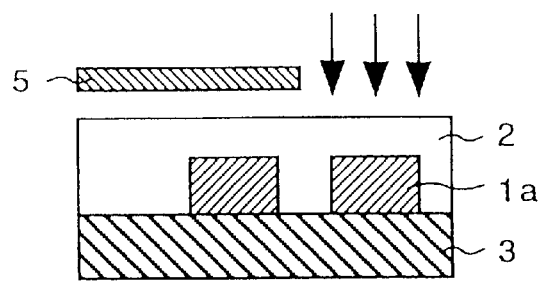
Figure 6:
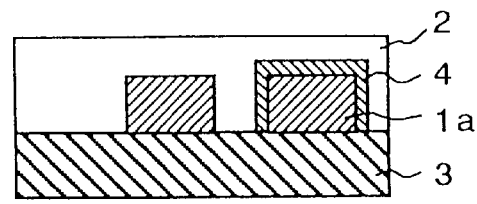
Figure 6:
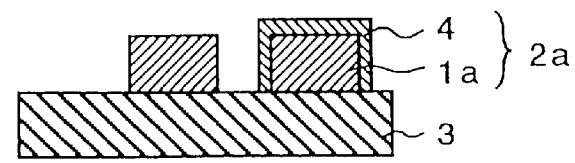

Initially, the steps of FIGS. 6(a) to 6(c) are same with those of FIGS. 3(a) to 3(c). The reducing of the developing time for forming a first resist pattern 1a shown in FIG. 6(b) is similar as explained in the previous embodiments.

As shown in FIG. 6(c), the second resist layer 2 is formed. Thereafter, as shown in FIG. 6(d), a part of the semiconductor substrate 3 is shielded with a light-shielding plate 5, and the selected region is re-exposed to a g or i ray of a Hg lamp. Thereby, an acid is generated in the first resist pattern 1a. Then, as shown in FIG. 6(e), a crosslinked layer 4 is formed along the interface of the second resist 2 contacting with the first resist pattern 1a in the exposed portion.

The step of FIG. 6(f) is similar to that of FIG. 3(f) and is not further illustrated herein.

In the present embodiment too as in the first embodiment, the density of the acid remaining in the surface layer of the first resist pattern 1a is made high, and the thickness of the cross linked layer 4 is made large. That is the frame-worked thickness of the resist pattern is increased.

In this way, the crosslinked layer 4 is formed on the first resist pattern 1a in the selected region of the semiconductor substrate 3 as shown in FIG. 6(f), and any crosslinked layer is not formed in the first resist pattern in the other region.

According to the above-mentioned method, the appropriate exposure mask allows the film to be exposed on the semiconductor device 1 so that the exposed portion and unexposed portion is discriminated from each other, and thereby the region of the second resist pattern to be crosslinked and the region of the second resist pattern to be not crosslinked are formed in the boundary portion between the second resist pattern and the first resist pattern.

Thus, fine holes or fine spaces having different dimensions can be formed on the same semiconductor substrate.

Figure 7:
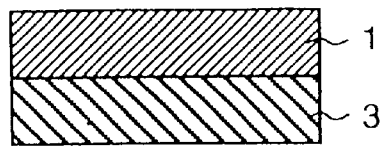
FIGS. 7(a) to 7(f) show process flow charts illustrating a method for forming a resist pattern according to the first embodiment of the present invention.
Figure 7:
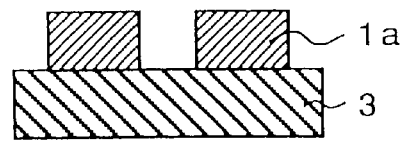
Figure 7:
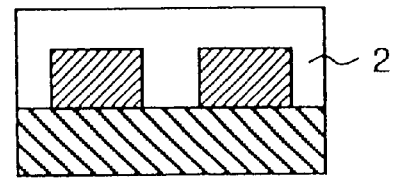
Figure 7:
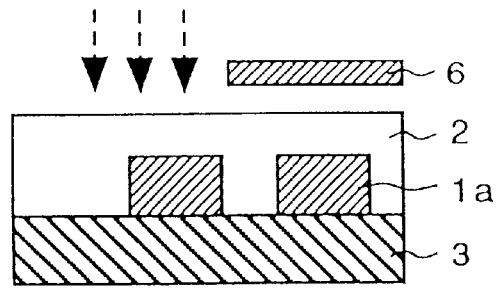
Figure 7:
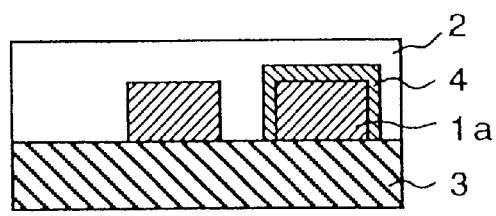
Figure 7:
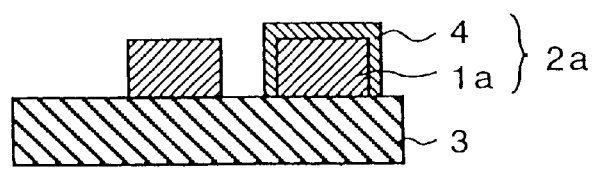

FIGS. 7(a) to 7(f) are a process flow chart illustrating another method of selectively forming a fine resist pattern in a desired region of the semiconductor substrate 1. The steps of FIGS. 7(a) to (c) are same with FIGS. 2(a) to 2(c). The reducing of the developing time for forming a first resist pattern 1a shown in FIG. 7(b) is similar as explained in the previous embodiments.

Then, as shown in FIG. 7(c), the second resist layer 2 is formed. Then, a specific region of the semiconductor substrate 3 is shielded with an electron beam-shielding plate 6. Then, an electron beam is irradiated on the other region.

Thereafter, the substrate is thermally treated in the step of FIG. 7(e). Thereby, a crosslinked layer is formed in the region where not irradiated with the electron beam, while any crosslinked layer is not formed in the region where irradiated with the electron beam.

The step of FIG. 7(f) is similar to that of FIG. 2(f) and is not further explained here.

In the present embodiment too as in the first embodiment, the density of the acid remaining in the surface layer of the first resist pattern 1a is made high, and the thickness of the cross linked layer 4 is made large. That is the frame-worked thickness of the resist pattern is increased.

In this way, the crosslinked layer 4 is formed on the first resist pattern 1a in the selected region of the semiconductor substrate 3 as shown in FIG. 7(f), and any crosslinked layer is not formed on the first resist pattern in the other region. Thus, fine holes or fine spaces having different dimensions can be formed on the same semiconductor substrate.

Hereinabove, the method of forming a finely isolated resist pattern on the substrate 3 has been described in detail. The finely isolated resist pattern may be formed not only on the semiconductor substrate 3, but also on an insulating film, such as a silicon oxide film, or on a conductive layer, such as a polysilicon film, depending on a manufacturing process of a semiconductor device.

The formation of a finely isolated resist pattern of the present invention is not limited as to the type of underlying film, but such a resist pattern may be formed on any type of underlying layer or substrate capable of forming a resist pattern thereon and can be formed on any required underlying layer or substrate. All of these substrates are generically referred to as a "semiconductor base layer" herein.

In the present invention, the thus formed finely isolated resist pattern is used as a mask, followed by etching the underlying semiconductor substrate or the semiconductor base layer including various types of thin films to form fine spaces or holes in the semiconductor base layer. Thus, a semiconductor device can be manufactured.

In the present invention, a material and its composition for the second resist, and an MB temperature are appropriately determined, and the finely isolated resist pattern may be obtained by formation of the crosslinked layer on the first resist pattern. Then, a semiconductor substrate or semiconductor base layer may be etched by using such fine resist pattern as a mask. As a result, the side surfaces of the etched substrate can be effectively roughened.

Second Embodiment

FIGS. 8(a) to 8(e) show a process flow illustrating a method for forming a finely isolated resist pattern according to a second embodiment of the present invention. Referring to FIGS. 1(a) to 1(c) and FIGS. 8(a) to 8(e), the method for forming a finely isolated resist pattern of the second embodiment and a method for manufacturing a semiconductor device using the pattern are described.

Figure 8:
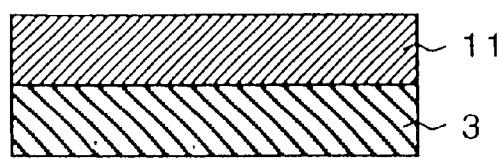
FIGS. 8(a) to 8(e) show process flow charts illustrating a method for forming a resist pattern according to a second embodiment of the present invention.
Figure 8:
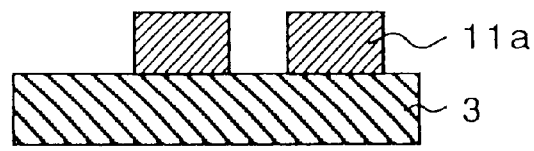
Figure 8:
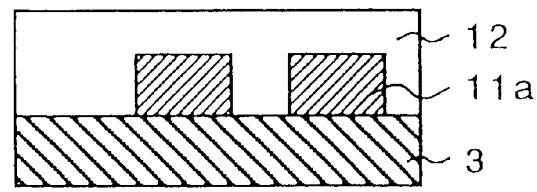
Figure 8:
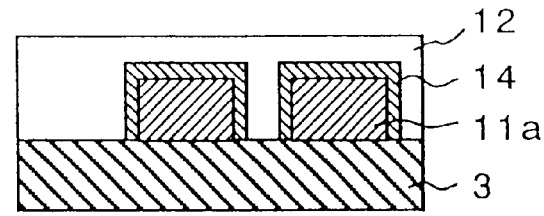
Figure 8:
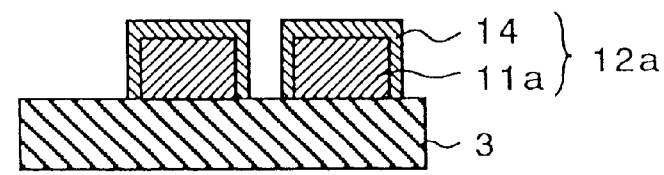

First, as shown in FIG. 8(a), a first resist 11 containing a small amount of an acidic substance therein is coated onto a semiconductor substrate 3. The first resist 11 is pre-baked or thermally treated at 70 to 110° C. for around 1 minutes, followed by exposure to a g or i ray of a Hg lamp through a mask having such a pattern as shown in FIG. 1(a), 1(b) or 1(c).

After the light exposure of the first resist 1, post-exposure baking (PEB) may be performed, for example at a PEB temperature of 50 to 130° C., if necessary, to improve the resolution of the resist 1.

Subsequently, an alkaline aqueous solution of about 0.05 to 3.0 wt % of TMAH (tetra methyl ammonium hydroxide) is used for development. The feature of the present embodiment is also to substantially shorten the time required for the development as compared to the usual development.

FIG. 8(b) shows the thus formed first resist pattern 11a. In the present embodiment, the density of acid remaining in the surface layer of the first resist pattern 11a is made substantially high compared with the preceding technologies with a normal or usual developing time. As explained later, this will contribute to increase a thickness of the cross linking layer.

As the material for the first resist 11, those materials explained in the first embodiment maybe effectively used. The detailed description on this is not made herein to avoid duplication. The acid contained in the first resist 11 preferably includes low molecular weight carboxylic acids.

Thereafter, the substrate is thermally treated by means of PEB at 10 to 130° C., if necessary, to improve resolution of the resist, and then developed with a diluted aqueous solution of about 2.0% of TMAH (tetra methyl ammonium hydroxide).

Subsequently, the substrate may be subjected to post-development baking, if necessary. This thermal treatment affects a subsequent mixing reaction and should be set at an appropriate temperature. The process described above is similar to a conventional resist pattern-forming process except that the resist 11 containing an acid is used.

After the resist pattern 11a is formed as shown in FIG. 8(b), a second resist 12 is coated over the semiconductor substrate 3 as shown in FIG. 8(c). The second resist 12 is mainly composed of a crosslinkable material capable of crosslinking in the presence of an acid, and may be dissolved in a solvent which will not dissolve the first resist 11.

The material for the second resist 12 and the solvent therefor are same with those set out in the first embodiment, and are effectively used in this second embodiment. Therefore, the detailed description on these is not made to avoid duplication.

After the coating of the second resist 12, this is pre-baked, if necessary. This thermal treatment affects a subsequent mixing reaction and should be set at an appropriate temperature.

Then, as shown in FIG. 8(d), the semiconductor substrate 3 is thermally treated, for example at 60 to 130° C., thereby causing crosslinking reaction to occur in the vicinity of the interface between the second resist 12 and the first resist pattern 11a by means of an acid from the small amount of the acidic substance contained in the first resist pattern 11a. Thus, a crosslinked layer 14 obtained through the crosslinking reaction is formed in the second resist 12 to cover the first resist pattern 11a.

Then, as shown in FIG. 8(e), the non-crosslinked portion of the second resist 12 is developed with water or a liquid developer such as of TMAH and removed from the substrate.

In the present embodiment too as in the first embodiment, the density of the acid remaining in the surface layer of the first resist pattern 11a is made high, and the thickness of the cross linked layer 4 is made large. That is the frame-worked thickness of the resist pattern is increased.

According to the above process, there can be obtained a resist pattern wherein a hole inner diameter of a hole pattern or an isolation width of a line pattern is reduced, or an area of an island pattern is enlarged.

In the second embodiment, the first resist 11 need not to generate an acid by exposure to light, but the first resist 11 is prepared to contain an acid therein. The acid is diffused by application of heat for crosslinkage. The acid contained in the first resist 11 should preferably be low molecular weight carboxylic acids, but are not critical so far as they can be mixed with a resist solution.

The finely isolated resist pattern is formed on various types of semiconductor substrates, and can be used as a mask for forming finely isolated spaces or fine holes in the semiconductor substrate in a manner as described with respect to the afore-stated first embodiment.

Third Embodiment

FIGS. 9(a) to 9(g) show a process flow illustrating a method for forming a finely isolated resist pattern according to a third embodiment of the present invention. Referring to FIGS. 1(a) to 1(c) and FIGS. 9(a) to 9(g), a method for forming a finely isolated resist pattern and a method for manufacturing a semiconductor device using the pattern are described.

Figure 9:
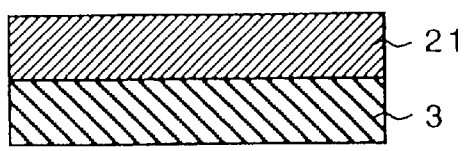
FIGS. 9(a) to 9(g) show process flow charts illustrating a method for forming a resist pattern according to a third embodiment of the present invention.
Figure 9:
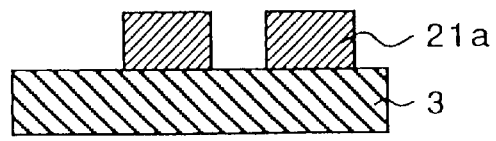
Figure 9:
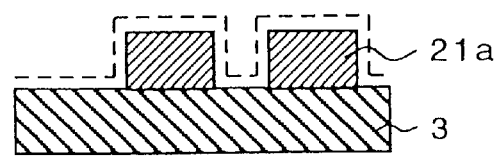
Figure 9:
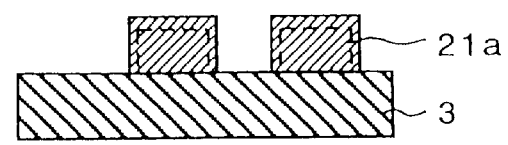
Figure 9:
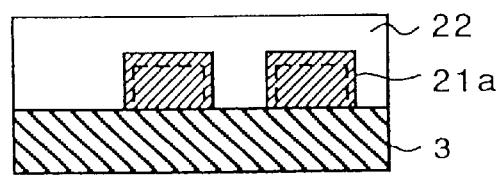
Figure 9:
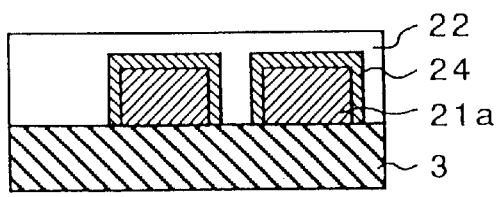
Figure 9:
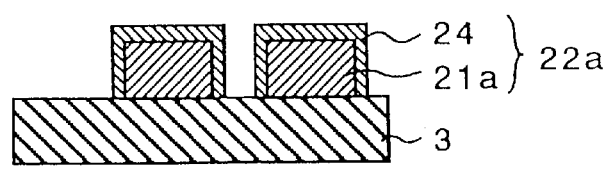

Initially, as shown in FIG. 9(a), a first resist 21 is coated onto a semiconductor substrate 3. The first resist 21 is pre-baked or thermally treated at 70 to 100° C. for around 1 minute. Then, the first resist 21 is exposed to light through a mask having such a pattern as shown in FIG. 1(a), 1(b) or 1(c). The exposing light may be a g ray or an i ray of a Hg lamp depending on a sensitizing wavelength of the first resist 21.

As the material for the first resist 21, those explained with respect to the first embodiment may be effectively used. The detailed explanation of the material is not made herein to avoid duplication.

Then, the substrate is thermally treated by means of PEB, for example at 10 to 130° C., to improve resolution of the resist, if necessary. Then the first resist 21 is developed with a diluted aqueous solution of about 2.0% of TMAH (tetramethylammonium hydroxide). The feature of the present embodiment is to substantially shorten the time required for the development.

FIG. 9(b) shows the resultant first resist pattern 21a. In the present embodiment, the density of acid remaining in the surface layer of the first resist pattern 11a is made substantially high compared with the preceding technologies with a normal or usual developing time. As explained later, this will contribute to increase a thickness of the cross linking layer.

Subsequently, post-development baking may be effected, if necessary. This thermal treatment affects a subsequent mixing reaction and should be set at an appropriate temperature. The above process is similar to a conventional resist-forming process.

After the formation of the pattern of FIG. 9(b), the semiconductor substrate 3 is subjected to dipping in an acid solution as shown in FIG. 9(c). The puddle developing method or the acid vaporize method may ordinarily be used as the treatment technique. The semiconductor substrate may be subjected to surface treatment with an acidic gas. The acidic solution or acidic gas may be made of either an organic acid or an inorganic acid. Preferably, acetic acid of low concentration is used.

In this step, the acid is soaked to in the vicinity of the interface of the resist pattern 21a to form a thin layer containing the acid, followed by rinsing with pure water, if necessary.

Then, as shown in FIG. 9(e), a second resist 22 is coated onto the first resist pattern 21 as shown in FIG. 9(e). The second resist 22 is mainly composed of a crosslinkable material capable of crosslinking in the presence of an acid, and will be dissolved in a solvent which will not dissolve the first resist 21. The material for the second resist 22 and the solvent therefor are same or similar to those set out in the first embodiment, and are effectively used in this embodiment. The detailed description on these is not made to avoid duplication.

After the coating of the second resist 22, the resist 22 is pre-baked, if necessary. This thermal treatment affects a subsequent mixing reaction and should be set at an appropriate temperature.

Then, as shown in FIG. 9(f), the semiconductor substrate 3 is thermally treated, for example at 60 to 130° C. and baked for crosslinkage, thereby causing crosslinking reaction in the vicinity of the interface between the second resist 22 and the first resist pattern 21a by means of an acid fed from the first resist pattern 21a. Thus, a crosslinked layer 4 is formed in the second resist 22 through the crosslinking reaction to cover the first resist pattern 21a.

Then, as shown in FIG. 9(g), the non-crosslinked portion of the second resist 22 is developed with water or a liquid developer such as TMAH, and removed from the substrate.

In the present embodiment too as in the first embodiment, the density of the acid remaining in the surface layer of the first resist pattern 21a is made high, and the thickness of the cross linked layer 24 is made large. That is the frame-worked thickness of the resist pattern is increased.

According to the above treatments, a resist pattern is obtained in which a hole inner diameter of a hole pattern or an isolation width of a line pattern is reduced, or an area of an island pattern is enlarged.

As will be apparent from the above, according to the third embodiment, no step of generating an acid in the first resist layer by exposure to light is necessary. Prior to the formation of the second resist 22 on the first resist pattern 21a, the surface is treated with an acidic gas, which is diffused for crosslinkage in a succeeding thermal treating step.

The finely isolated resist pattern is formed on various types of semiconductor substrates, and can be used as a mask for forming finely isolated spaces or fine holes in the semiconductor substrate in a manner as described with respect to the afore-stated first or second embodiments.

EXAMPLES

Examples relating to the foregoing first to third embodiments are described. One example may be related to one or more embodiments as explained above, so that the examples are presented collectively.

First, Examples 1 to 5 relating to a first resist material are described.

Example 1

As a first resist, a resist pattern was formed by use of an i ray resist constituted of novolac resin and naphthoquinonediazide, which are dissolved in ethyl lactate and propylene glycol monoethyl acetate.

More particularly, the resist was dropped over a Si wafer and spin-coated, followed by pre-baking under conditions of 85° C./70 seconds to cause the solvent to be evaporated from the resist to form an about 1.0 m thick first resist.

Figure 10:
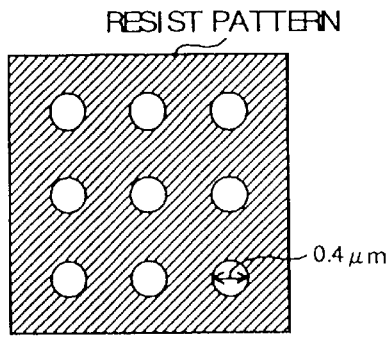
FIGS. 10(a) to 10(c) show first resist patterns in Examples 1, 2 and 3 of the present invention.
Figure 10:
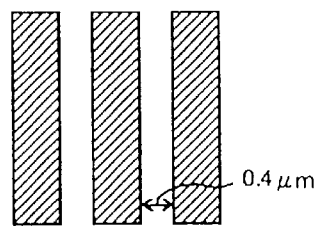
Figure 10:
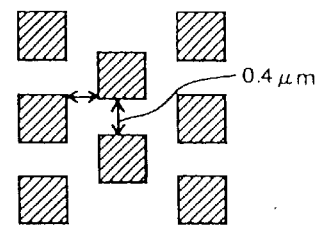

Thereafter, the first resist was exposed to an i ray from an i ray reduced projection exposing device through masks as shown in FIG. 1(a), 1(b) or 1(c), followed by PEB treatment under conditions of 120° C./70 second. Then, the first resist was developed in a shortened time with an alkaline developer (NMD3, made by Tokyo Ohka Kogyo Co., Ltd.) to obtain resist patterns having such isolation sizes as shown in FIGS. 10(a) to 10(c).

Example 2

As a first resist, there was formed a resist pattern from an i ray resist constituted of novolac resin and naphthoquinonediazide dissolved in 2-heptanone.

The resist was dropped over a Si wafer and spin-coated, thereby a resist film of about 0.8 μm thick was formed. Thereafter, the film was pre-baked under conditions of 85° C./70 seconds to dry the solvent in the film. Thereafter, the film was exposed to light from an i ray reduced projection exposing device through masks as shown in FIGS. 1(a), 1(b) and 1(c), followed by PEB treatment under conditions of 120° C./70 seconds. Then, the film was developed in a shortened time with an alkaline developer (NMD3, made by Tokyo Ohka Kogyo Co., Ltd.) to obtain resist patterns having such isolation sizes as shown in FIGS. 10(a) to 10(c).

Example 3

As a first resists there was formed a resist pattern from an i ray resist constituted of novolac resin and naphthoquinonediazide, which are dissolved in a mixed solvent of ethyl lactate and butyl acetate.

The resist was dropped over a Si wafer and spin-coated, thereby a resist film of about 1.0 μm thick is formed. Thereafter, the film was pre-baked under conditions of 100° C./90 seconds to dry the solvent in the film.

Thereafter, the film was exposed to light by use of a stepper of Nikkon Corporation, through masks as shown in FIGS. 1(a), 1(b) and 1(c), followed by PEB treatment under conditions 110° C./60 seconds. Then, the film was developed in a shortened time with an alkaline developer (NMD3, made by Tokyo Ohka Kogyo Co., Ltd.) to obtain resist patterns as shown in FIGS. 10(a) to 10(c).

Example 4

As a first resist, there was formed a resist pattern from a chemically amplified excimer resist of Tokyo Ohka Kogyo Co., Ltd.

Figure 11:
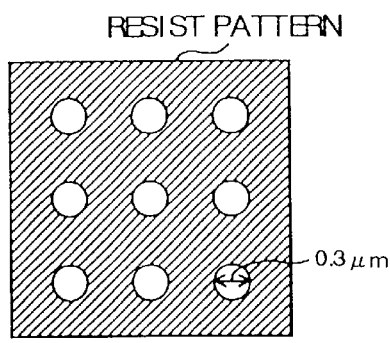
FIGS. 11(a) to 11(c) show first resist patterns in Example 4 of the present invention.
Figure 11:
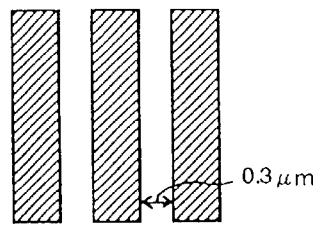
Figure 11:
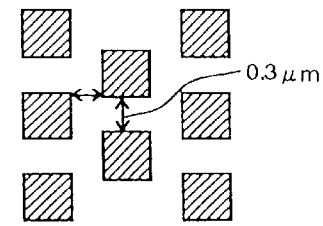

The resist was dropped over a Si wafer and spin-coated, thereby a resist film of about 0.8 μm thick was formed. Thereafter, the film was pre-baked under conditions of 90° C./90 seconds to dry the solvent in the film. Thereafter, the film was exposed to light by use of a KrF excimer reduced projection exposing device through masks as shown in FIGS. 1(a), 1(b) and 1(c), followed by PEB treatment under conditions of 100° C./90 seconds. Then, the film was developed in a shortened time with an alkaline developer (NMD-W, made by Tokyo Ohka Kogyo Co., Ltd.) to obtain resist patterns as shown in FIGS. 11(a) to 11(c).

Example 5

As a first resist, there was formed a resist pattern from a chemically amplified resist of Hishiden Chemical Ind. Co., Ltd. (Melker, J.Vac. Sci. Technol. B11 (6) 2773, 1993) constituted of t-Boc polyhydroxystyrene and an acid generator.

The resist was dropped over a Si wafer and spin-coated, thereby a film of about 0.52 μm thick was formed. Thereafter, the film was pre-baked under conditions of 120° C./180 seconds to dry the solvent in the film. Thereafter, Espacer ESP-100 of Showa Denko K.K. serving as an antistatic agent was spin-coated onto the resist in the same manner as set out above, followed by baking under conditions of 80° C./120 seconds.

Using an EB drawing device, an image was drawn at 17.4 μC/cm2, followed by PEB treatment under conditions of 80° C./120 seconds. Then, the antistatic film was removed with pure water, and then developed in a shortened time with an alkaline TMAH developer (NMD-W, made by Tokyo Ohka Kogyo Co., Ltd.).

Figure 12:
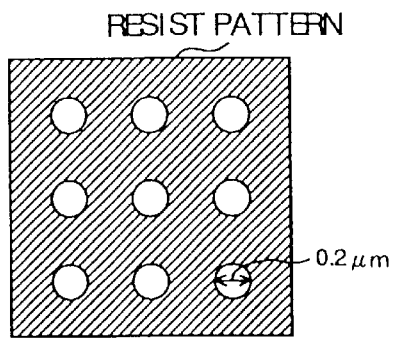
FIGS. 12(a) to 12(c) show first resist patterns in Example 5 of the present invention.
Figure 12:
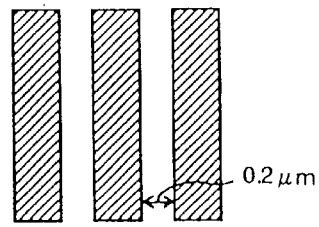
Figure 12:
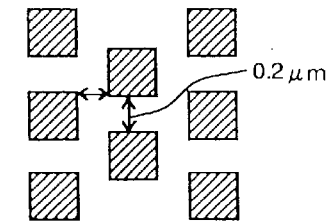

As a result, there were EB resist patterns with a space of about 0.2 μm as shown in FIGS. 12(a) to 12(c).

Next, Examples 6 to 13 relating to the second resist material are shown.

Example 6

As a second resist material, 400 g of pure water was added to 100 g of a 20 wt % aqueous solution of each of KW3 and KW1, which were, respectively, a polyvinyl acetal resin of Sekisui Chemical Co., Ltd., in one liter messflask, followed by mixing under agitation at room temperature for 6 hours to obtain 5 wt % aqueous solutions of polyvinyl acetal KW3 and KW1, respectively.

Example 7

In the same manner as in Example 6, there were obtained 5 wt % aqueous solutions of polyvinyl alcohol resin, oxazoline-containing water-soluble resin (Epocross WS 500, made by Nippon Shokubai Co., Ltd.), and styrene-maleic anhydride copolymers (SMA 1000, 1400H, made by ARCO Chemical Co.) used in place of the polyvinyl acetal resins of Example 6, respectively.

Example 8

As a second resist material, there was obtained an aqueous solution of about 10 wt % of methylolmelamine by mixing 100 g of methoxy methylol melamine (Cymel 370 of Mitsui Cynamide Co., Ltd.), 780 g of pure water, and 40 g of IPA (isopropyl alcohol) in a one liter messflask under agitation at room temperature for 6 hours.

Example 9

As a second resist material, there was obtained an aqueous solution of about 10 wt % of ethyleneurea by mixing 100 g of (N-methoxymethyl) methoxy ethleneurea, 100 g of (N-methoxymethyl) hydroxyethyleneurea, or 100 g of N-methoxy methylurea respectively with 860 g of pure water, and 40 g of IPA (isopropyl alcohol) in a one liter messflask under agitation at room temperature for 6 hours.

Example 10

As a second resist material, there was obtained a solution of a mixture of a water-soluble resin and a water-soluble agent by mixing 160 g of the aqueous solution of polyvinyl acetal KW3 obtained in Example 6, 20 g of the methoxy methylol melamine aqueous solution obtained in Example 8, and 20 g of pure water under agitation at room temperature for 6 hours.

Example 11

As a second resist, there were obtained solutions of a water-soluble resin and the respective water-soluble crosslinking agents by mixing a mixture of 160 g of the aqueous solution of polyvinyl acetal KW3 obtained in Example 6 and each of 20 g of the (N-methoxymethyl) methoxyethyleneurea aqueous solution, 20 g of (N-methoxymethyl) hydroxyethyleneurea, and 20 g of N-methoxymethylurea with 20 g of pure water under agitation at room temperature for 6 hours.

Example 12

As a second resist material, there were obtained aqueous solutions by mixing 160 g of the aqueous solution of polyvinyl acetal KW3 obtained in Example 6 and the methoxyethyleneurea aqueous solution obtained in Example 9 in different amounts of 10 g, 20 g and 30 g, and 20 g of pure water under agitation at room temperature for 6 hours.

As a result, there were obtained three kind of second resist aqueous solutions which had concentrations of the water-soluble methoxyethyleneurea crosslinking agent of about 11 wt %, 20 wt %, and 27 wt % relative to the polyvinyl acetal resin.

Example 13

As a second resist, there were obtained three kinds of mixed solutions having different mixing ratios between polyvinyl acetal resin and polyvinyl alcohol resin by mixing an aqueous solution of 5 wt % of polyvinyl alcohol resin, among those water-soluble resin solutions obtained in Example 7, in different amounts of 0 g, 35.3 g and 72.2 g with 100 g of the 5 wt % polyvinyl acetal resin aqueous solution obtained in Example 6 under agitation at room temperature for 6 hours.

Next, Examples 14 to 22 relating to the formation of fine resist patterns are described.

Example 14

The second resist material obtained in Example 12 was dropped over the Si wafer, on which the first resist pattern obtained in Example 3 had been formed, and spin-coated, followed by pre-baking under conditions of 85° C./70 seconds to form a second resist film.

Figures 13, 14, 15:
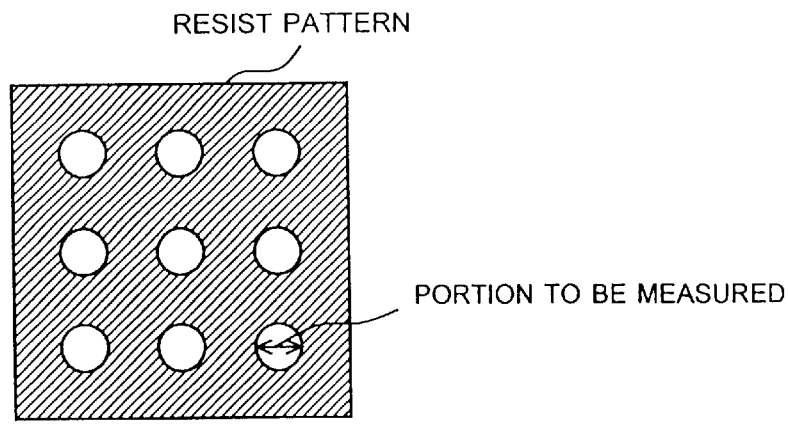
FIG. 13 shows a second resist pattern in Example 14 of the present invention.
FIG. 14 is a table showing the relation between the mixing ratio of water-soluble resins and the resist pattern size after formation of crosslinked layer in Example 14.
FIG. 15 is a table showing the relation between the presence or absence of light exposure and the resist pattern size after formation of crosslinked layer in Example 15.

Subsequently, mixing bake (MB) under conditions of 120° C./90 seconds was performed to cause crosslinking reaction to proceed. Then, the second resist film was developed with pure water to develop and remove a non-crosslinked layer therefrom, followed by post-baking under conditions of 90° C./90 seconds to form a second resist pattern as shown in FIG. 13. In FIG. 13, the hole diameter of the second resist pattern was selected as a portion to be measured, and a resist pattern size was measured after formation of the crosslinked layer while changing a mixing ratio of the water-soluble resin. The results are shown in Table of FIG. 14.

The results reveal that when the mixing ratio between the polyvinyl acetal resin and the polyvinyl alcohol resin is changed, the thickness of the crosslinked layer formed on the first resist can be controlled.

Example 15

The KW1 resin aqueous solution obtained in Example 6 serving as the second resist material was dropped over the Si wafer obtained in Example 2, in which the first resist pattern had been formed beforehand, and spin-coated, followed by pre-baking under conditions of 85° C./70 seconds to obtain a second resist film.

Next, the wafer was exposed to light from an i ray exposure device over the entire surface thereof, followed by mixing baking (MB) under conditions of 150° C./90 seconds to cause crosslinking reaction to proceed. Thereafter, water was used for development, whereupon a non-crosslinked layer was developed and removed. Then, post-baking was performed under conditions of 110° C./90 seconds to form a second resist crosslinked layer on the hole pattern of the first resist pattern as shown in FIG. 13. The hole diameter of the second resist pattern shown in FIG. 13 was selected as a portion to be measured, and a resist pattern size after the formation of the crosslinked layer was measured as to the case where light was exposed to the entire surface and also the case where not exposed. The results are shown in Table of FIG. 15.

The results reveal that the first resist hole pattern size, which was 0.4 µm prior to the formation of the crosslinked layer, was found to be about 0.13 µm when light was exposed to the entire surface and to be reduced to about 0.10 µm where no light was entirely exposed.

In this case, when the entire surface is exposed prior to the MB baking, the crosslinking reaction has more proceeded than the case where no exposure is effected, resulting in a thicker crosslinked layer formed on the first resist surface.

Example 16

The mixed solution of polyvinyl acetal resin and ethyleneurea obtained in Example 11, serving as the second resist, was applied onto the Si wafer obtained in Example 2 in which the first resist pattern had been formed beforehand.

The second resist material was dropped and spin-coated, followed by pre-baking under conditions of 85° C./70 seconds to form a second resist film. Next, the second resist film was subjected to mixing baking (MB) under three conditions of 105° C./90 seconds, 115° C./90 seconds, and 125° C./90 seconds, thereby causing crosslinking reaction to proceed. Pure water was used for development, and a non-crosslinked portion for each film was developed and removed. Then, post-baking was carried out under conditions of 90° C./90 seconds to form a second resist crosslinked layer on the first resist layer as shown in FIG. 16(a), 16(b) or 16(c). The hole diameter of the second resist pattern and the spaces of the line and island patterns shown in FIG. 16 are, respectively, selected as a portion to be measured. While changing the mixing bake (MB) temperature, the resist pattern sizes after the formation of the crosslinked layer were measured. The results are shown in Table of FIG. 17.

The results reveal that the inner diameter of the hole pattern and the space sizes of the line pattern and island pattern, which were 0.4 μm after formation in Example 2, were, respectively, reduced as shown in FIG. 17 after the formation of the crosslinked layers. The degree of the reduction increase with an increasing MB temperature. From this, it will be seen that the control of the MB temperature enables one to control the crosslinking reaction accurately.

Example 17

The polyvinyl acetal aqueous solution obtained in Example 6, the aqueous solution of a mixture of polyvinyl acetal resin and ethyleneurea obtained in Example 12, and aqueous solutions of mixtures of polyvinyl alcohol resin and ethyleneurea having different concentrations of ethyleneurea were each applied, as a second resist, onto the Si wafer obtained in Example 3 in which the first resist pattern had been formed.

More particularly, each second resist material was dropped and spin-coated, followed by pre-baking under conditions of 85° C./70 seconds to form a second resist film.

Thereafter, the resist film was mixing baked (MB) under conditions of 65° C./70 seconds+100° C./90 seconds and crosslinked. Pure water was used for development, and a non-crosslinked layer was developed and separated, followed by post-baking under conditions of 90° C./90 seconds, thereby forming a second resist crosslinked layer on the first resist pattern as shown in FIG. 13. The hole diameter of the second resist pattern shown in FIG. 13 was selected as a portion to be measured. While changing the mixing ratio of the water-soluble crosslinking agent, the resist pattern size after the formation of the crosslinked layer was measured. The results are shown in Table of FIG. 18.

As a result, the inner diameter of the hole pattern, which was about 0.4 μm when formed in Example 3, was reduced as shown in FIG. 18. The degree of the reduction increases with an increasing amount of the water-soluble crosslinking agent.

From this, it will be seen that the control in the mixing ratio of the water-soluble materials enables one to control crosslinking reaction accurately.

Further, it will be seen that, at the same amount of a crosslinking agent, the degree of reduction can be controlled by changing the type of water-soluble resin.

Example 18

The polyvinyl acetal aqueous solution obtained in Example 6, and mixed solutions of the polyvinyl acetal resin aqueous solution obtained in Example 11 and an aqueous solution of a mixture of N-methoxymethyl-methylethyleneurea, (N-methoxymethyl) hydroxyethyleneurea, and N-methoxymethylurea, each serving as a water-soluble crosslinking agent, were, respectively, applied as a second resist onto the Si wafer obtained in Example 3 in which the first resist pattern had been formed.

Each second resist material was dropped and spin-coated, followed by pre-baking under conditions of 85° C./70 seconds to form a second resist film.

Thereafter, the resist film was mixing baked (MB) under conditions of 65° C./70 seconds+100° C./90 seconds for crosslinkage. Pure water was used for development, and a non-crosslinked layer was developed and removed. Then, post-baking was done under conditions of 90° C./90 seconds, thereby forming a second resist crosslinked layer on the first resist pattern as shown in FIG. 13. The hole diameter of the second resist pattern shown in FIG. 13 was selected as a portion to be measured. While changing the type of water-soluble crosslinking agent, the resist pattern size after the formation of the crosslinked layer was measured. The results are shown in Table of FIG. 19.

As a result, the inner diameter of the hole pattern, which was about 0.4 μm when formed in Example 3, was reduced as shown in FIG. 19. It has been confirmed that the degree of the reduction depends on the type of water-soluble crosslinking agent.

From this, it will be seen that the change in types of water-soluble materials enables one to control crosslinking reaction.

Example 19

The polyvinyl acetal aqueous solution obtained in Example 6, and aqueous solutions of mixtures of the polyvinyl acetal resin aqueous solution obtained in Example 11 and methoxyethyleneurea serving as a water-soluble crosslinking agent were used as a second resist for application onto the Si wafer obtained in Example 4 wherein the first resist pattern had been formed.

Each second resist material was dropped and spin-coated, followed by pre-baking under conditions of 85° C./70 seconds to form a second resist film.

Thereafter, the resist film was mixing baked (MB) at a given temperature for 90 seconds for crosslinkage. Pure water was used for development, and a non-crosslinked layer was developed and removed. Then, post-baking was done under conditions of 90° C./90 seconds, thereby forming a second resist crosslinked layer on the first resist pattern as shown in FIG. 13. The hole diameter of the second resist pattern shown in FIG. 13 was selected as a portion to be measured. While changing the amount of the water-soluble crosslinking agent and reaction temperature, the resist pattern size after the formation of the crosslinked layer was measured. The results are shown in Table of FIG. 20.

As a result, the inner diameter of the hole pattern, which was about 0.3 μm when formed in Example 4, was reduced as shown in FIG. 20, revealing a significant difference depending on the amount of the water-soluble agent and the reaction temperature.

From this, it will be seen that when using the chemically amplified resist capable of generating an acid by irradiation of light, the control of the resist pattern size based on the crosslinking reaction is enabled.

Example 20

The polyvinyl acetal aqueous solution obtained in Example 6 and aqueous solutions of mixtures of the polyvinyl acetal resin aqueous solution obtained in Example 11 and methoxyethyleneurea serving as a water-soluble crosslinking agent were used for application onto the Si wafer obtained in Example 5 wherein the first resist pattern had been formed.

Each second resist material was dropped and spin-coated, followed by pre-baking under conditions of 85° C./70 seconds to form a second resist film.

Thereafter, the resist film was mixing baked (MB) under conditions 105° C., 115° C./90 seconds, thereby causing crosslinking reaction.

Pure water was used for development, and a non-crosslinked layer was developed and removed. Thereafter, post-baking was carried out under conditions of 90° C./90 seconds, thereby forming a second resist crosslinked layer on the first resist pattern as shown in FIG. 13. The hole diameter of the second resist pattern shown in FIG. 13 was selected as a portion to be measured. While changing the amount of the water-soluble crosslinking agent and reaction temperature, the resist pattern size after the formation of the crosslinked layer was measured. The results are shown in Table of FIG. 21.

As a result, the inner diameter of the hole pattern, which was about 0.2 $\mu$m when formed in Example 5, was reduced as shown in FIG. 21, revealing that the degree of the reduction has a significant difference depending on the amount of the water-soluble material and the MB temperature.

From this, it will be seen that, when using the chemically amplified EB resist constituted of the t-boc polyhydroxystyrene and an acid generator, the control of the resist pattern size based on the crosslinking reaction is possible.

Example 21

An electron beam was selectively irradiated on the first resist pattern obtained in Example 2. The dose of the electron beam was 50 $\mu$C/cm2.

Thereafter, a mixed aqueous solution of the polyvinyl acetal resin aqueous solution obtained in Example 11 and methoxyethyleneurea serving as a water-soluble crosslinking agent was provided as a second resist, and was coated on the first resist pattern which had been irradiated with the electron beam. More particularly, the second resist material was dropped and spin-coated, followed by pre-baking under conditions of 85° C./70 seconds to form a second resist film.

The film was mixing baked (MB) under conditions of 120° C./90 seconds, thereby causing crosslinkage.

Finally, pure water was used for development, and a non-crosslinked layer was developed and removed. Therafter, post-baking was done under conditions of 110° C./70 seconds, thereby selectively forming a second resist crosslinked layer on the first resist pattern as shown in FIG. 13. The hole diameter of the second resist pattern shown in FIG. 13 was selected as a portion to be measured, and the resist patter size after the formation of the crosslinked layer was measured with respect to the beam-irradiated portion and the non-irradiated portion. The results are shown in Table of FIG. 22.

Figures 22, 23:
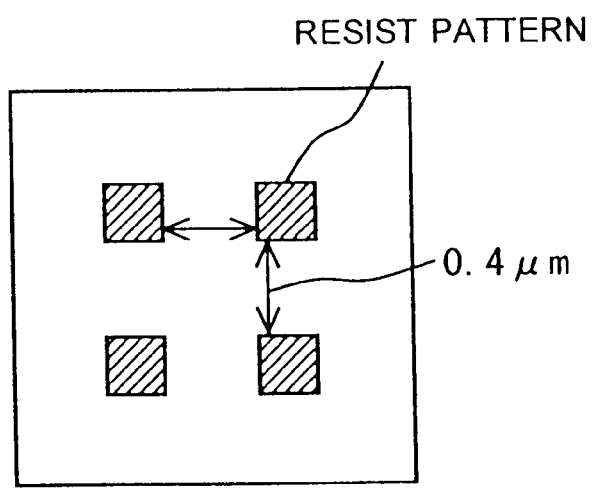
FIG. 22 is a table showing the relation between the presence or absence of electron beam irradiation and the resist pattern size after formation of crosslinked layer in Example 21 of the present invention.
FIG. 23 is a view showing a second resist pattern in Example 22 of the present invention.

As a result, the resist pattern with a hole size of about 0.4 $\mu$m formed in Example 2 was reduced, as shown in FIG. 22, in the portion not irradiated with the electron beam. As for the portion selectively irradiated with the electron beam, no crosslinking reaction occurred, and no reduction in the hole size was found.

From this, it will be seen that when an electron beam is selectively irradiated after formation of a resist pattern, no reaction takes place in the pattern of the irradiated portion, so that the selective size control of the resist pattern is possible.

Example 22

The first resist pattern obtained in Example 2 was formed on a Si wafer on which an oxide film was formed, thereby forming a first resist pattern as shown in FIG. 23.

Thereafter, the second resist material obtained in Example 12 was dropped and spin-coated, followed by pre-baking under conditions of 85° C./70 seconds. The film was mixing baked under conditions of 105° C./90 seconds, and a non-crosslinked layer was developed with pure water and removed. Thereafter, post-baking was done under conditions of 90° C./90 seconds to form a second resist crosslinked layer on the first resist layer.

The underlying oxide film was then etched by means of an etching device, and the pattern after the etching was observed.

For comparison, the wafer formed with such a first resist pattern as shown in FIG. 23, which was not treated according to the present invention, were likewise etched.

Figure 24A:
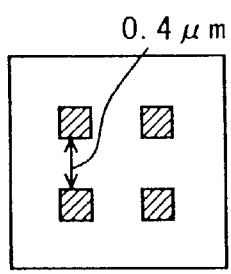
FIGS. 24(a) to 24(c) show views showing a pattern form after etching of an underlying oxide film in Example 22 of the present invention.
Figure 24B:
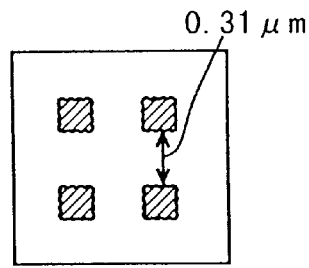
Figure 24C:
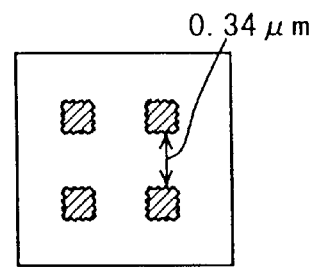

The results was compared. In the case where the present invention is not applied, the result is as shown in FIG. 24(*a*). In the cases where the present invention is applied, the results are as shown in FIGS. 24(*b*) and 24(*c*). In the latter cases, the isolation width of the oxide film pattern is reduced, and side surfaces of the oxide film pattern are roughened.

It will be seen that the degree of the roughening is controllable depending on the amount of the crosslinking agent being mixed.

Now, additional explanation will be given with regard to the shortened developing time performed in each of the above embodiments.

Figure 25:
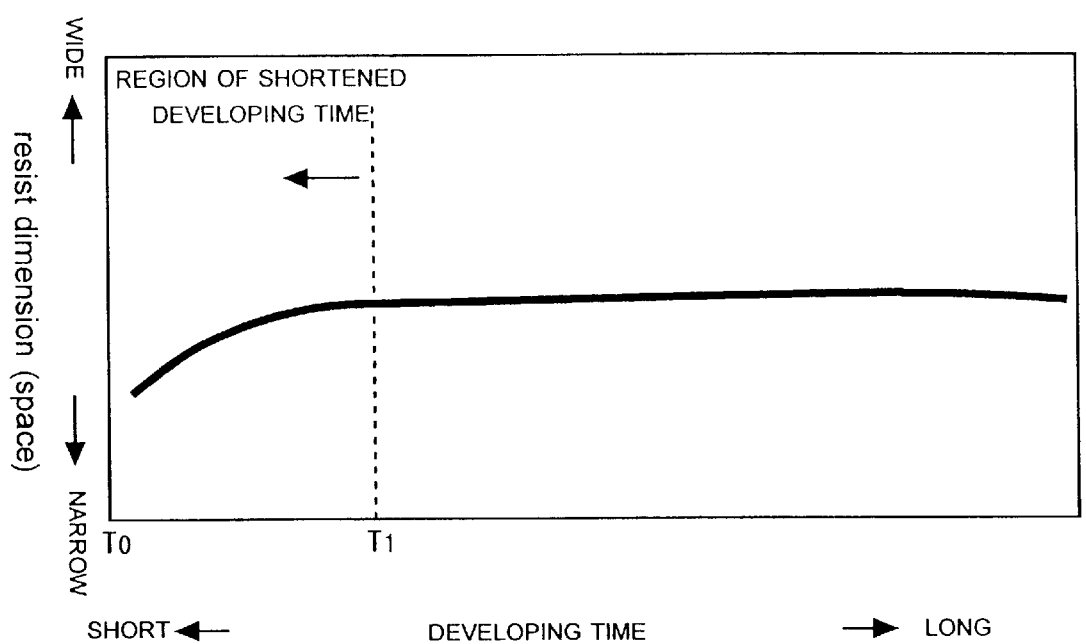
FIG. 25 is a graph to explain the shortened developing time in each of the above embodiments.

FIG. 25 shows the relation of the space or gap dimensions of a resist pattern (horizontal axis) formed and the time or duration of the developing (vertical axis).

As seen from FIG. 25, when the developing time is longer that T1, then the resist final dimension comes to be almost constant. But, when the developing time is less than T1 and approach to T0, then the resist final dimensions vary, and become shorter with the shorter developing time.

In the conventional art, the developing time has been sufficiently secured in order to avoid variation of the dimensions. (right hand side of T1)

However in the present invention, the developing time is intently shortened than usual, and the time range, where the resist final dimensions vary, is positively used. (left hand side of T1)

Accordingly in the present invention, the shortened developing time for forming the first resist pattern means the time or duration where the resist final dimensions vary depending on the developing time.

Alternatively, the change of the resist final dimensions may mean the change more than 10 nm in view of the variance in SEM length measurement.

The shortened developing time in the present invention means the time duration in that range.

Now, the effects and advantages of the present invention may be summarized as follows.

As having been described in detail, according to the present invention, obtained are the materials and methods for forming a finely isolated resist pattern. Thereby, it was made possible to form a resist pattern which exceeds a wavelength limit in the fineness of a resist isolation pattern or a resist hole pattern.

Hence, the hole diameter of a hole resist pattern can be further reduced over conventional counterparts, and an isolation width of a spaced resist pattern can also be further reduced over conventional counterparts.

Using the finely isolated resist pattern thus obtained as a mask, there can be formed finely isolated spaces or holes on a semiconductor substrate or semiconductor base layer.

According to such a manufacturing method, there can be obtained a semiconductor device having finely isolated spaces or holes.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-240528, filed on Aug. 26, 1999 including specification, claims, drawings and summary, on which the Convention priority of the present application is based, are incorporated herein by reference in its entirety.

What is claimed is:

1. A method of manufacturing a semiconductor device, said method comprising the steps of:
   forming a first resist layer on a semiconductor base layer, said first resist layer being made of a first resist and capable of generating an acid;
   forming a first resist pattern from said first resist layer by developing in a reduced developing time, said first resist pattern being capable of generating an acid;
   forming a second resist layer on said first resist pattern, said second resist layer undergoing crosslinking reaction in the presence of an acid;
   forming a crosslinked film, having a thickness at a portion of said second resist layer contacting with said first resist pattern by the agency of an acid fed from said first resist pattern;
   forming a second resist pattern by removing non-crosslinked portions of said second resist layer;
   etching said semiconductor base layer through said second resist pattern working as a mask; and
   controlling the thickness of the crosslinked film by controlling the developing time.

2. The method of manufacturing a semiconductor device according to claim 1, comprising controlling the final dimension of said first resist pattern by controlling the developing time.

3. The method of manufacturing a semiconductor device according to claim 1, wherein said reduced developing time is in the range of time where the final dimension of said first resist pattern is larger than more than 10 nm when developed with usual developing time where final dimension comes of the resist pattern to be substantially constant.

4. The method of manufacturing a semiconductor device according to claim 1, further including the step of:
   heating said first resist pattern and said second resist layer formed on said first resist pattern, thereby forming a cross linked film in the surface layer of said second resist layer contacting with said first resist pattern.

5. The method of manufacturing a semiconductor device according to claim 1, further comprising the step of:
   exposing the selected area of said first resist pattern and said second resist layer formed on said first resist pattern, thereby forming a cross linked film in the surface layer of said second resist layer contacting with said first resist pattern in said selected area.

6. A method of manufacturing a semiconductor device, said method comprising the step of:
   forming a first resist layer on a semiconductor base layer, said first resist layer being made of a first resist and capable of generating an acid;
   forming a first resist pattern from said first resist layer by developing in a reduced developing time, said first resist pattern being capable of generating an acid;
   forming a second resist layer on said first resist pattern, said second resist layer undergoing crosslinking reaction in the presence of an acid;
   forming a crosslinked film at a portion of said second resist layer contacting with said first resist pattern by the agency of an acid fed from said first resist pattern;
   forming a second resist pattern by removing non-crosslinked portions of said second resist layer;
   etching said semiconductor base layer through said second resist pattern working as a mask; and
   irradiating with an electron beam at the portion other than the selected portion of said first resist pattern prior to forming said second resist layer on said first resist pattern, thereby forming a cross linked film in the surface layer of said second resist layer contacting with said first resist pattern in said selected area.

7. A semiconductor device manufactured by the method according to claim 1.

* * * * *